United States Patent [19]
Ershov

[11] Patent Number: 5,852,627
[45] Date of Patent: Dec. 22, 1998

[54] LASER WITH LINE NARROWING OUTPUT COUPLER

[75] Inventor: Alexander I. Ershov, San Diego, Calif.

[73] Assignee: Cymer, Inc., San Diego, Calif.

[21] Appl. No.: 926,721

[22] Filed: Sep. 10, 1997

[51] Int. Cl.⁶ .................................................. H01S 3/08
[52] U.S. Cl. ........................................................ 372/108
[58] Field of Search .............................. 372/97, 102, 108

[56] References Cited

U.S. PATENT DOCUMENTS

| | | | |
|---|---|---|---|
| 5,150,370 | 9/1992 | Furuya et al. | 372/106 |
| 5,307,358 | 4/1994 | Scheps | 372/108 |
| 5,404,366 | 4/1995 | Wakabayashi et al. | 372/108 |
| 5,559,816 | 9/1996 | Basting et al. | 372/27 |

OTHER PUBLICATIONS

Littman, Michael G. and Metcalf, Harold J., "Spectrally narrow pulsed dye laser without beam expander", Applied Optics, vol. 17, No. 14, 15 Jul. 1978, pp. 2224–2227.

Loree, T. R., Butterfield, K.B. and Barker, D. L., "Spectral tuning of ArF and KrF discharge lasers" Appl. Phys. Lett., 32(3), 1 Feb. 1978, pp. 171–173.

Sengupta, Uday K., "Krypton fluoride excimer laser for advanced microlithography", Optical Engineering, Oct. 1993, vol. 32 No. 10, pp. 2410–2420.

Trebino, Rick, Roller, James P. and Siegman, Anthony E., "A Comparison of the Cassegrain and Other Beam Expanders in High–Power Pulsed Dye Lasers", IEEE Journal of Quantum Electronics, vol. QE–18(8), pp. 1208–1213 (Aug. 1982).

*Primary Examiner*—Rodney Bovernick
*Assistant Examiner*—Robert E. Wise
*Attorney, Agent, or Firm*—John R. Ross, Esq.

[57] ABSTRACT

A laser having a line-narrowing output coupler. This output coupler reflects a portion of light generated in the gain medium and provides a spectral narrowing of that reflected light. A portion of the line narrowed beam is directed back into the gain medium for further amplification and a portion is transmitted as a part of the laser output. In a preferred embodiment, the laser is line narrowed in the rear as well as by the line narrowing output coupler.

10 Claims, 4 Drawing Sheets

LASER WITH LINE NARROWING OUTPUT COUPLER

This invention relates to devices for line narrowing lasers and especially to grating-based line narrowing devices.

BACKGROUND OF THE INVENTION

Techniques for Line Narrowing

Techniques for decreasing the bandwidth of the output of lasers are well known. Several such techniques used on excimer lasers are discussed by John F. Reintjes at pages 44–50 in *Laser Handbook*, Vol. 5, North-Holland Physics Publishing, Elsevier Science Publishers B.V. These techniques include the utilization of gratings, including echelle gratings for wavelength selection. Use of beam expanding prisms ahead of the grating can increase the effectiveness of the grating.

A prior art narrow band KrF excimer laser is shown in FIG. 1. The resonance cavity of excimer laser 2 is formed by output coupler 4 (which is a 10 percent partially reflecting mirror) and echelle grating 16. A portion of the laser output beam 20 (having a cross section of about 3 mm in the horizonal direction and 20 mm in the vertical direction) exits the rear of laser chamber 3. This portion of the beam is expanded in the horizonal direction by prisms 8, 10 and 12 and reflected off mirror 14 onto echelle grating 16. Mirror 14 is pivoted to select the narrow band output for laser 2. Grating 16 is arranged in a Littrow configuration so that the selected narrow band of wavelengths is reflected back off mirror 14 and back through prisms 12, 10 and 8 and into chamber 3 for amplification. Light at wavelengths outside the selected narrow band is disbursed so that this disbursed out-of-band light is not reflected back into the laser chamber. Typical KrF lasers operating in a pulse mode may have a cavity length of about 1 m and produce pulses having a duration of about 15 to 25 ns. Thus, photons within the resonance cavity will make, on the average, about 2 to 4 round trips within the cavity. On each round trip, about 90 percent of the beam exits at the output coupler and about 10 percent is sent back for further amplification and line narrowing. The beam is repeatedly line narrowed as it passes through the line narrowing module.

With this prior art arrangement, the bandwidth of the KrF laser is reduced from its natural bandwidth of about 300 pm (full width half maximum or FW) to about 0.8 pm. Some applications of KrF lasers, however, require greater narrowing of the bandwidth. One such application is 248 nm micro-lithography where, in order to achieve a resolution of <0.25μ, a laser bandwidth of 0.6 pm, or better, is required. Thus, what is needed is an improvement to prior art line narrowing units which will provide greater narrowing of the bandwidth of laser beams.

SUMMARY OF THE INVENTION

The present invention provides a laser having a line-narrowing output coupler. This output coupler reflects a portion of light generated in the gain medium and provides a spectral narrowing of that reflected light. A portion of the line narrowed beam is directed back into the gain medium for further amplification and a portion is transmitted as a part of the laser output. In a preferred embodiment, the laser is line narrowed in the rear as well as by the line narrowing output coupler.

DETAILED DESCRIPTION OF PREFERRED EMBODIMENTS

First Preferred Embodiment

Figure 1:
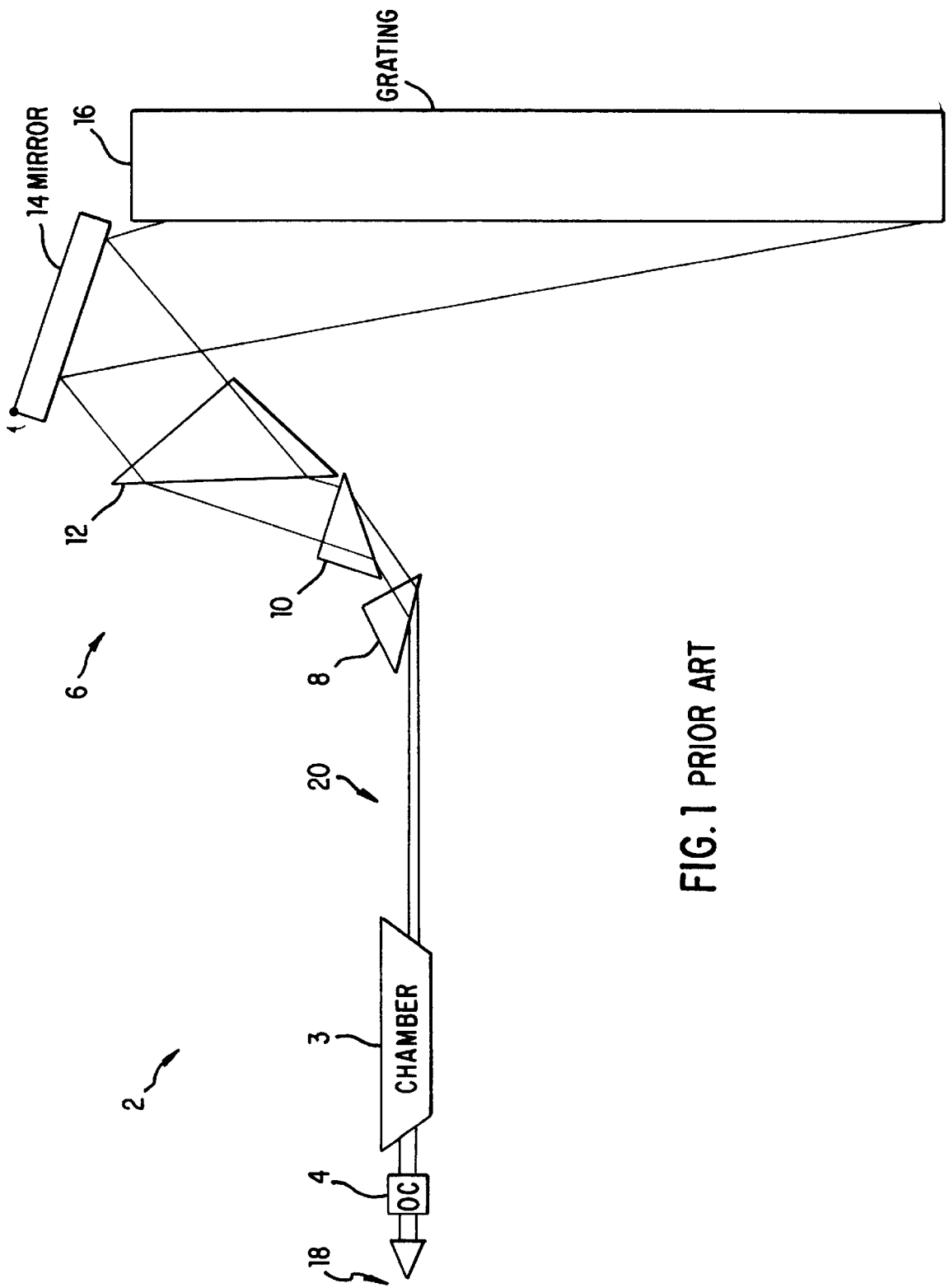
FIG. 1 shows a prior art line narrowing technique.
Figure 2:
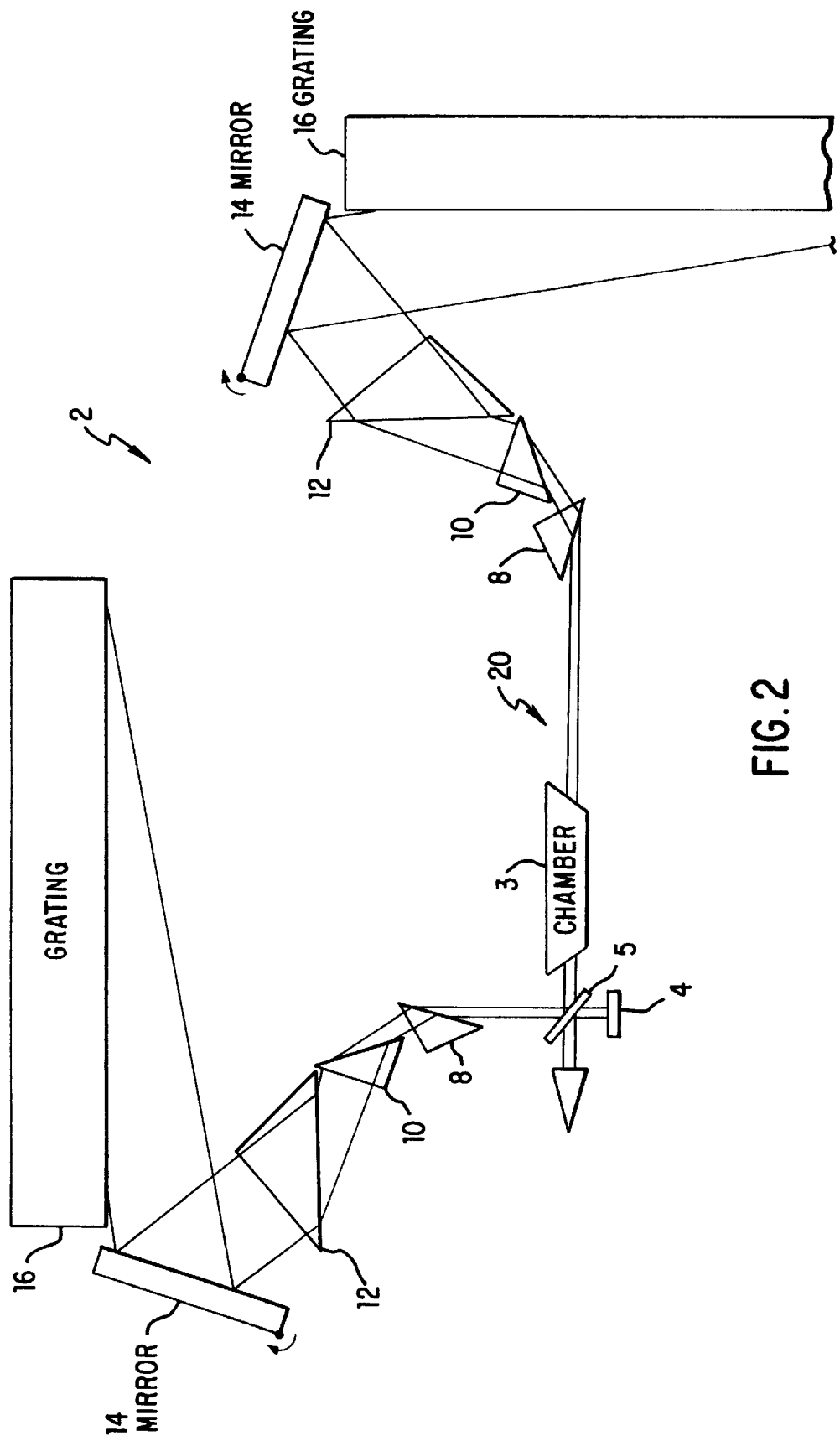
FIG. 2 is a drawing showing a preferred embodiment of the present invention.

A first preferred embodiment of the present invention is shown in FIG. 2. This laser system has a line narrowing package (LNP) at its rear which is exactly the same as shown in the prior art FIG. 1 drawing and explained in the background section of this specification. However, the output coupler of the prior art configuration was a 10 percent, partially reflecting mirror, oriented perpendicular to the output laser beam. In the present embodiment, that output coupler has been replaced with a line narrowing output coupler. This particular line narrowing output coupler utilizes an off-the-shelf prior art LNP, partially reflecting mirror 5 and a highly reflective mirror 4. The partially reflecting mirror 5 is oriented in a plane tilted 45 degrees with respect to a plane perpendicular to the output beam direction and has a reflectivity of about 40%. Thus, 40 percent of the light from the laser chamber 3 reflects off mirror 5 and is line narrowed by beam expanding prisms 8, 10 and 12 and grating 16. Mirror 14 can be rotated to select the same spectral range as the LNP at the rear of the laser. Spectrally narrowed light reflected from grating 16 is returned to partially reflecting mirror 5 where 40 percent of the light is transmitted back into laser chamber 3 for further amplification. About 60 percent of the spectrally narrowed light passes through mirror 5 and is reflected from a totally reflecting mirror 4 (aligned perpendicular to the split-off beam direction). Then, 40 percent of this light is reflected by mirror 5 and joins the output beam. About 60 percent is transmitted through mirror 5 and is further line narrowed by prisms 8, 10 and 12 and grating 16. This twice line-narrowed light returns back to partial reflecting mirror 5 where 40 percent of it is transmitted back to the laser, and 60 percent passes through and is reflected off mirror 4. Thus, the light keeps bouncing back and forth between mirror 4 and LNP, each time losing its energy on reflection back to the laser and to the output beam.

In addition to these "useful" reflections, there are some absorption losses inside the LNP. The absorption occurs each time the light passes through the LNP. The losses will depend on the reflectivity of the LNP and the reflectivity of mirror 5.

Table 1 shows the summary of the losses introduced by the output coupler of the present invention where the reflectivity of the LNP is 50, 60 or 70 percent; and the reflectivity of mirror 5 is 30 or 40 percent.

TABLE 1

| Reflectivity of Front LNP (%) | Reflectivity of Mirror 5 (%) | Light Emitted (%) | Light Reflected (%) | Losses in Output Coupler (%) |
|---|---|---|---|---|
| 50 | 30 | 74 | 6 | 20 |
| 60 | 30 | 75 | 8 | 17 |
| 70 | 30 | 77 | 10 | 13 |
| 50 | 40 | 66 | 10 | 24 |
| 60 | 40 | 68 | 12 | 20 |
| 70 | 40 | 69 | 15 | 16 |
| Prior Art Output Coupler | | 90 | 10 | 0 |

The first column shows the reflectivity of the LNP. The difference between this reflectivity and 100 percent is the absorption losses in the LNP. The second column shows the reflectivity of mirror 5. No absorption is assumed, and whatever portion is not reflected is transmitted. The following three columns show light coupling properties of this output coupler.

For the normal operation of KrF line-narrowed lasers, it is typically required that the reflectivity of the output coupler back to the laser be at least 10 percent. In the case of the prior art output coupler, the rest of the light (about 90 percent) comes out as an output beam. Table 1 shows that the optimum reflectivity for the spectrally line narrowed light can be achieved in the output coupler of the present invention as well. One can also see that, depending on the LNP, the optimum reflectivity of mirror 5 varies slightly. Thus, the preferred reflectivity of mirror 5 is about 30 percent for 70 percent reflective LNP and goes up to about 40 percent for less efficient 50 percent reflective LNP. One can also see from Table 1 that mirror 5, with 40 percent reflectivity, will provide adequate coupling for all the range of LNPs. In this case, one can expect 16 to 24 percent additional losses as compared to the prior art output coupler. These losses would mean 16 to 24 percent reduction in pulse energy, all other parameters being the same. Applicant expects that this new output coupler would reduce the line width of the laser to about 0.4 to 0.5 pm (FWHM) as compared to about 0.8 pm, which is typical to the prior art technique discussed in the background section of this specification.

Other Embodiments

FIGS. 3–8 are line drawings describing various embodiments of the present invention.

Figure 3:
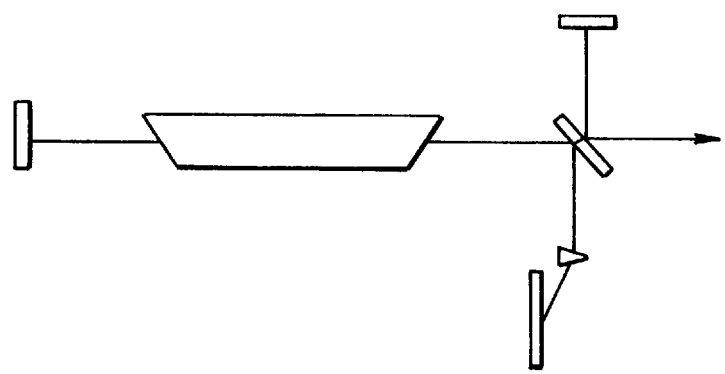
FIGS. 3 through 8 show alternative embodiments of the present invention.

FIG. 3 is a line drawing of the embodiment shown in FIG. 2 and described above, except that the LNP at the rear of the laser is replaced with a totally reflecting mirror so that all of the line narrowing is accomplished by the line narrowing output coupler.

Figure 4:
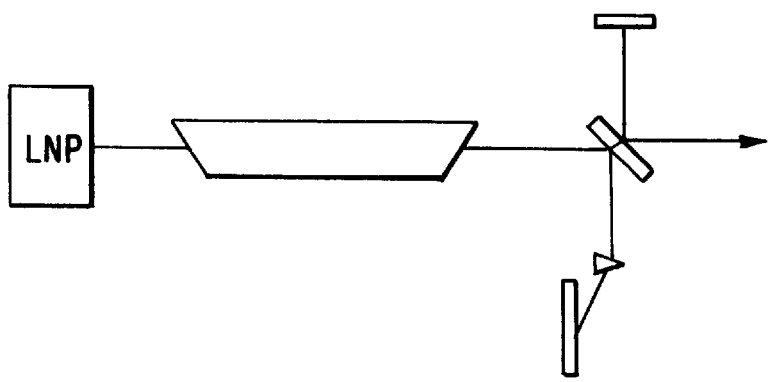

FIG. 4 is a line drawing of the embodiment shown in detail in FIG. 2.

Figure 5:
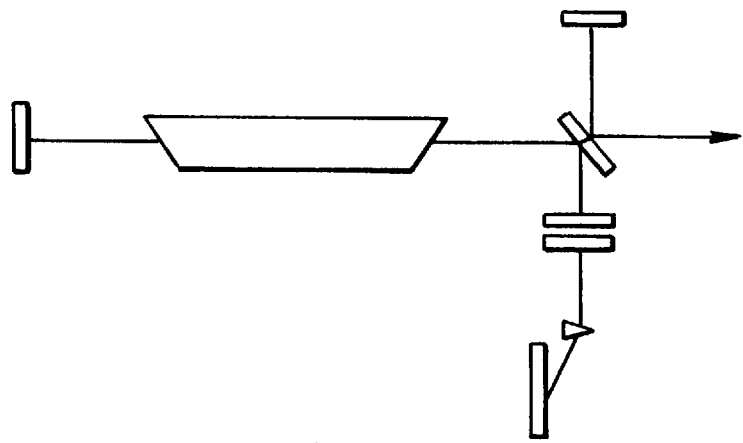

FIG. 5 is just like the embodiment shown in FIG. 3, except a Fabri-Perot etalon is provided between the partially reflecting mirror and the beam expander. This etalon provides for even more efficient line narrowing by the output coupler of the present invention. This etalon can be either Piezo tunable, pressure tunable or otherwise tunable by well known prior art means to the same wavelength as LNP.

Figure 6:
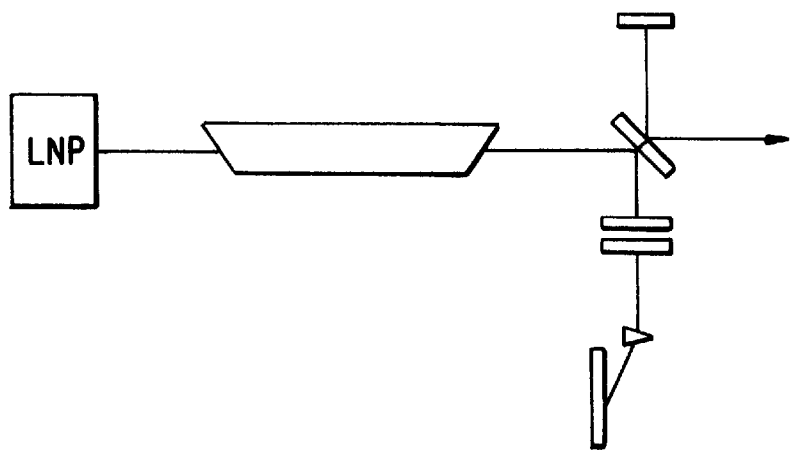

FIG. 6 is just like the embodiment shown in FIG. 5 except the totally reflecting mirror at the rear has been replaced by an LNP.

Figure 7:
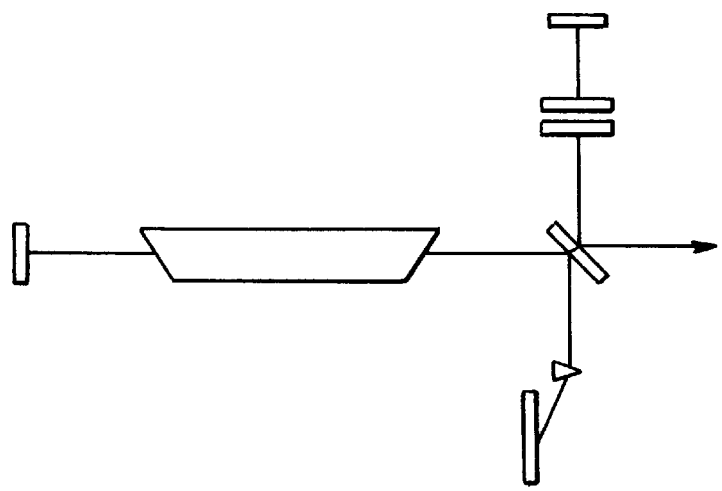

In the FIG. 7 embodiment, the etalon is between the partially reflecting mirror and the totally reflecting mirror.

Figure 8:
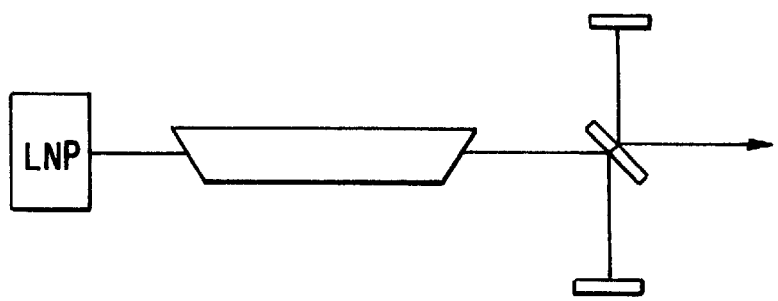

In the FIG. 8 embodiment, the output coupler consists of a partially reflecting mirror 5 and two totally reflecting mirrors 4. These totally reflecting mirrors provide two line narrowing functions. First, they reflect a portion of the output back toward the rear LNP where it is further line narrowed. Second, they function together to provide interference which effectively enhances the line narrowing of the laser output. That interference works similarly to etalon Fabri-Perot, and it is important to provide the proper spacing between the two mirrors to achieve the maximum constructive interference at the desired range of wavelengths. Therefore, preferably micronic spacial adjustments (not shown) are provided for mirrors 4 in the FIG. 8 embodiment. Alternatively, these micronic adjustments could be automated and controlled with a feedback system controlled by wavelength measurements of the output beam.

Although this very narrow band laser has been described with reference to a particular embodiment, it is to be appreciated that various adaptations and modifications may be made. For example, the partially reflecting mirror 5 could be positioned at angles other than 45 degrees without substantially affecting performance. However, as the angle deviates from 45 degrees, the layout becomes more difficult to accomplish. Also, as the angle of incidence approaches 90 degrees, it becomes more difficult to obtain the desired partial reflectivity. Therefore, the preferred range of angles is between 10 and 80 degrees. Also, the techniques described for use on a KrF laser which operates at a nominal wavelength of 248 nm can also be applied to ArF lasers; however, the optics must be designed for 193 nm. Therefore, the invention is only to be limited by the appended claims.

What is claimed is:

1. A line narrowing output coupler for line narrowing a light beam, defining an output beam direction, from a gain medium of a laser system, said line narrowing output coupler comprising:
   A. a partially reflecting mirror oriented in a plane at an angle of 10 to 80 degrees with a plane perpendicular to said output beam direction, so as to permit a portion of light from said gain medium to pass as a component of an output beam and to reflect a portion of the light from said gain medium,
   B. highly reflecting optic, and
   C. a line narrowing means configured to narrow the spectrum of the light reflected from said partially reflecting mirror and to at least once reflect back to said partially reflecting mirror line narrowed light in a direction such that portions of said line narrowed light is reflected from said partially reflecting mirror back into said gain medium for further amplification and portions of said line narrowed light is transmitted through said partially reflecting mirror, reflected from said totally reflecting optic and then reflected out of said laser system by said partially reflecting mirror as additional components of said output beam.

2. A line narrowing output coupler as in claim 1 wherein said line narrowing means comprises at least one beam expander and a grating.

3. A line narrowing output coupler as in claim 2 wherein said at least one beam expander is a three-prism beam expander and said grating is an echelle grating.

4. A line narrowing output coupler as in claim 3 wherein said line narrowing means further comprises a tuning mirror.

5. A line narrowing output coupler as in claim 2 wherein said line narrowing means further comprises an etalon.

6. A line narrowing output coupler as in claim 1 wherein said highly reflecting optic is a totally reflecting mirror.

7. A line narrowing output coupler as in claim 1 wherein said line narrowing means comprises two totally reflecting mirrors, positioned on opposite sides of said totally reflecting mirror so as to produce constructive interference of light at a desired range of wavelengths.

8. A line narrowing coupler as in claim 1 wherein said angle is about 45 degrees.

9. A narrow band laser system comprising:

A. a laser chamber defining a rear aperture and a output aperture,

B. a rear line narrowing means positioned so as to line narrow light from said laser chamber exiting said rear aperture, C. a line narrowing output coupler means configured to transmit portions of light form said laser chamber exiting said output aperture out of said laser system as components of an output beam, to line narrow portions of the light from said laser chamber exiting said output aperture, defining front end line narrowed light, and to reflect at least a portion of said front end line narrowed light back into the laser chamber for further amplification and to reflect a portion of said front end line narrowed light out of said laser system as additional components of the output beam.

10. A line narrowing output coupler as in claim 9 wherein said laser chamber is an excimer laser chamber.

* * * * *